(12) United States Patent
Shin et al.

(10) Patent No.: US 7,517,467 B2
(45) Date of Patent: Apr. 14, 2009

(54) METHOD FOR FORMING HIGH-RESOLUTION PATTERN HAVING DESIRED THICKNESS OR HIGH ASPECT RATIO USING DEEP ABLATION

(75) Inventors: Dong-Youn Shin, Daegu-si (KR);
Dong-Soo Kim, Daejeon-si (KR);
Chung-Hwan Kim, Seoul (KR);
Taik-Min Lee, Daejeon-si (KR);
Jeong-Dai Jo, Daejeon-si (KR);
Byung-Oh Choi, Daejeon-si (KR)

(73) Assignee: Korea Institute of Machinery & Materials (KR)

( * ) Notice: Subject to any disclaimer, the term of this patent is extended or adjusted under 35 U.S.C. 154(b) by 128 days.

(21) Appl. No.: 11/612,636

(22) Filed: Dec. 19, 2006

(65) Prior Publication Data
US 2007/0259474 A1    Nov. 8, 2007

(30) Foreign Application Priority Data
May 3, 2006    (KR)    ............... 10-2006-0039985

(51) Int. Cl.
*B44C 1/22*    (2006.01)
*C03C 15/00*    (2006.01)
*C03C 25/68*    (2006.01)
*C23F 1/00*    (2006.01)

(52) U.S. Cl. ................ 216/65; 427/555; 427/556
(58) Field of Classification Search ............ 216/65; 427/555, 556
See application file for complete search history.

(56) References Cited

U.S. PATENT DOCUMENTS

| | | | |
|---|---|---|---|
| 6,074,893 A | 6/2000 | Nakata et al. | |
| 2003/0022107 A1 | 1/2003 | Yang et al. | |
| 2006/0009020 A1 | 1/2006 | Tanaka | |
| 2006/0063111 A1 | 3/2006 | Ali et al. | |

FOREIGN PATENT DOCUMENTS

WO    2006025016    3/2006

*Primary Examiner*—Roberts Culbert
(74) *Attorney, Agent, or Firm*—Cantor Colburn LLP

(57) ABSTRACT

Disclosed herein is a method of forming a pattern, comprising: attaching a single-layer or multi-layer sacrificial film made of a semi-solid or solid material on part or all of the surface of a substrate; irradiating the sacrificial film with a focusable energy beam such as a laser beam to form a region to be charged with a functional material; charging the functional material into the formed region using a method such as an inkjet; drying the functional material; and removing the sacrificial film, thus obtaining the desired pattern.

42 Claims, 7 Drawing Sheets

METHOD FOR FORMING HIGH-RESOLUTION PATTERN HAVING DESIRED THICKNESS OR HIGH ASPECT RATIO USING DEEP ABLATION

BACKGROUND OF THE INVENTION

1. Field of the Invention

The present invention relates to a method of forming a high-resolution pattern, and more particularly to a method of forming a high-resolution pattern having a high aspect ratio, the method comprising: an attachment step of attaching a sacrificial film on a substrate; a patterning step of irradiating the sacrificial film with a focusable energy beam to partially remove the sacrificial film so as to pattern the sacrificial film into the desired shape; and a deposition step of depositing a functional material into the region from which the sacrificial film was removed.

2. Description of the Prior Art

Generally, photolithography is used to form patterns for use in electronic devices. As used herein, the term "photolithography" refers to a technique of forming a shape using solubility resulting from a photochemical reaction. Specifically, photolithography comprises inducing a photochemical reaction, either on a film sensitive to a given kind of light or on a liquid photoresist, selectively on a portion exposed to light passed through a mask rather than a portion not exposed to the light, and subjecting the resulting film or photoresist to various processes, including development, deposition and removal, to finally make the desired pattern.

However, this photolithography method has problems in that a large amount of material is wasted and the process is complicated, leading to a reduction in efficiency. Also, because a mask having a large area is used, it is difficult to apply a new design in a short time.

Also, in a thick film process of depositing a functional material for patterns to a thickness of the micrometer scale or larger using a process such as sputtering or CVD within a short time, photolithography is unsuitable in terms of process efficiency. Thus, to overcome these problems with photolithography, an inkjet patterning method that can be used to make patterns directly on a substrate without any mask has been proposed.

This inkjet patterning method will now be described with reference to FIGS. 1a and 1b.

As shown in FIG. 1a, a functional material for forming a pattern is deposited on a substrate 10 from an inkjet print head H, and is dried to remove unnecessary ink carrier vehicle from the functional material. To aid in understanding the prior inkjet patterning method, the following example is given. The content of a functional material to be patterned, having a specific gravity of 10, is assumed to be 50 wt % based on the total weight of the ink. Also, the content of a carrier vehicle(s) having an average specific gravity of 1, to be removed upon drying, is assumed to be 50% based on the total weight of the ink. Herein, the volume fraction of the fractional material based on the total volume of the ink is about 9%. While complex physical phenomena are ignored to help understanding, it is assumed that the linewidth patterned with an inkjet is fixed, and that a uniform decrease in thickness occurs. As a result, the thickness of the pattern remaining after drying is only 9% of the thickness of the initial pattern. When such an inkjet is used to form a pattern, there is a problem in that an undesired excessive decrease in thickness occurs depending on the composition of the ink, and this phenomenon is shown in FIG. 1a. Also, to form a pattern having high resolution, that is, to reduce width, it is general to reduce the size of an ink drop. When a smaller ink drop is used in order to achieve high resolution as described above, a smaller amount of ink is deposited per unit area, as shown in FIG. 1b. As a result, the thickness of the resulting pattern is decreased in proportion to a decrease in linewidth, and thus it is physically difficult to achieve both objects of reducing linewidth and maintaining the desired pattern thickness.

Also, when the size of the ink drop is reduced to achieve high resolution, the targeting error of the ink drop increases relative to the scale of the pattern, thus causing a serious pattern error and forming an incorrect pattern.

SUMMARY OF THE INVENTION

The present invention has been made to solve the above-described problems occurring in the prior art, and it is an object of the present invention to achieve a high-resolution pattern by selectively removing a sacrificial film attached onto a substrate, using a focusable energy beam, and depositing a functional material selectively into the region from which the sacrificial film was removed. Another object of the present invention is to obtain a desired pattern thickness by selecting an initial sacrificial film having sufficient thickness in view of a reduction in thickness resulting from the drying of the ink and charging ink into the selected thickness of the film. Still another object of the present invention is to provide a substrate having formed thereon a free pattern, for use in said method.

To achieve the above objects, the present invention provides a method for forming a high-resolution pattern having a high aspect ratio using deep ablation, the method comprising: an attachment step of attaching a sacrificial film onto a substrate; a patterning step of irradiating the sacrificial film with a focusable energy beam to pattern the sacrificial film into the desired shape, thus forming a pattern; and a deposition step of selectively depositing a functional material into the region from which the sacrificial film was removed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1A:
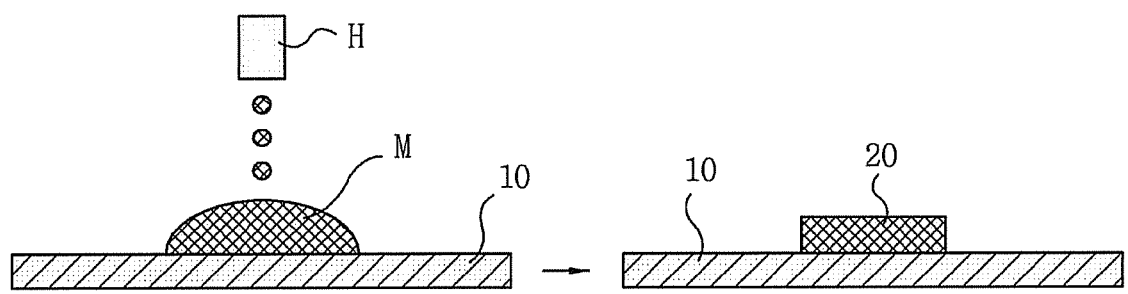
FIG. 1 is a schematic process diagram showing a method of forming a pattern according to the prior inkjet patterning method.
Figure 1B:
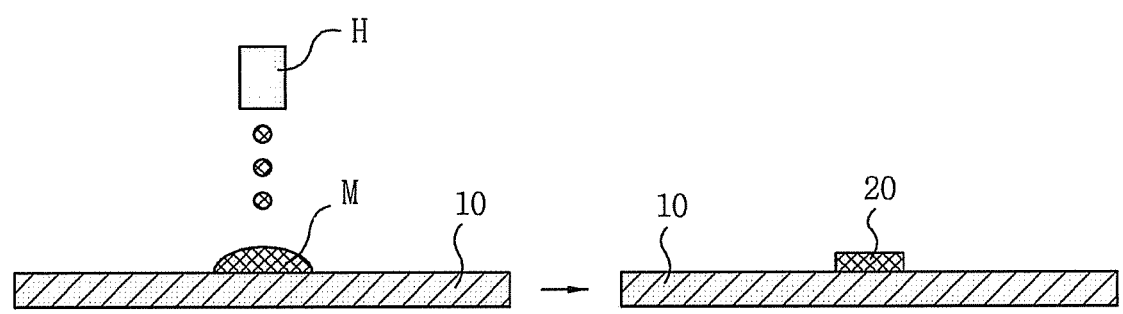

Hereinafter, the present invention will be described in detail with reference to the accompanying drawings.

As described above, the present invention provides a method for forming a high-resolution pattern, which can achieve a precise pattern linewidth and thickness by reducing width and, at the same time, maintaining a given height, the method comprising: patterning the sacrificial film attached onto a substrate, using a focusable energy beam, to form a pattern template, and then depositing a functional material into the pattern template. For this purpose, the inventive method comprises: an attachment step of attaching a sacrificial film onto a substrate; a patterning step of irradiating the sacrificial film with a focusable energy beam to pattern the sacrificial film into the desired shape, thus forming a pattern template; and a deposition step of depositing a functional material into the region (pattern template) from which the sacrificial film was removed.

Particularly, in the case where a thick film having a thickness of 1 micrometer or more is required, assuming that the volume fraction of a functional material remaining as a film shape after the drying of ink is $\alpha$ vol %, and that the pattern thickness to be achieved is $\beta$ μm, a semi-solid or solid sacrificial film having a thickness of $100 \times \beta/\alpha$ μm or more will be attached on the substrate in a sticky or adhesive form using, for example, a laminator.

However, the method of attaching the sacrificial film onto the substrate is not limited to the use of the laminator, and encompasses any conventional method capable of attaching a film-shaped product to the substrate.

The sacrificial film attached according to the above-described method is patterned with a focusable energy beam, and then a region into which ink can be charged is formed through ablation. The charged ink, i.e., the functional material, will be formed into a film after drying so as to function as a pattern.

Also, in order to provide a substrate having a free pattern formed thereon for use in said method, the sacrificial film is removed selectively according to the shape of the pattern required, using a focusable energy beam. The region from which the dry film resist is removed can be charged with one or more functional materials selected from among the following materials: conductive organic materials such as PEDOT (poly(3,4-ethylene dioxythiophene))-PSS(poly(4-styrenesulfonate)), conductive inorganic materials such as copper or aluminum nanoparticles, conductive material precursors such as organometallic compounds, organic/inorganic fluorescent or phosphorescent substances for use in electroluminescent devices, electrical insulators or dielectrics, and organic/inorganic semiconductor materials.

However, said materials are merely examples of the functional materials, and the choice of the functional material is determined depending on the intended use thereof.

Below, the method for forming the high-resolution pattern having a desired thickness or high aspect ratio according to the present invention will be described in further detail.

The method according to the present invention comprises: an attachment step (S1) of attaching a sacrificial film 30 onto a substrate 10 in a sticky or adhesive form; a pattern template-forming step (S2) of irradiating the sacrificial film 30 with a focusable energy beam to pattern the sacrificial film 30 into the desired shape; and a deposition step (S3) of depositing a functional material M into the pattern template 40 of the patterned sacrificial film 30.

Herein, the material of the substrate 10 is not specifically limited as long as it is used to form the pattern 20 thereon, and is conventionally used in the art.

According to a preferred embodiment of the present invention, if the pattern 20 is already formed on the substrate 10, a specific layer is not deposited on the pattern 20, but one or more layer selected from among the following layers may, if necessary, be deposited on the substrate 10: a protective layer for protecting the substrate 10 or the pattern 20 formed on the substrate 10 from contaminants generated before, during and after a process; a light shielding layer for protecting the substrate 10 or the pattern 20 formed on the substrate 10 either by shielding the energy of a focusable energy beam without transferring the energy to the underlying structure or by absorbing the energy so as to be removed by itself; an adhesive layer for increasing the adhesion of the sacrificial layer 30 to the substrate 10; and a removable film for protecting the adhesive layer during the storage of the substrate.

Herein, said layers can consist of a single layer or a plurality of layers, or can be made of a stack (or mixture) of materials performing the functions of the respective layers.

Meanwhile, either the light shielding layer or the protective layers can be deposited first in sequence, and can consist of a plurality of light shielding layers or protective layers, and the sticky or adhesive layer is generally formed at the uppermost portion of the substrate 10 and is protected with the removable film during the storage of the substrate. Herein, the removable film consists of an uppermost removable film and a lowermost removable film, in which the uppermost removable film forms the uppermost layer of the sacrificial film 30 to serve to protect the substrate 10 during the storage of the substrate 10, and the lowermost removable film forms the lowermost layer of the sacrificial film 30 to prevent the adhesive layer from being contaminated.

Also, to make the removal of said layers easy, these layers are made of, for example, materials which are easily removed by an energy beam having the same wavelength ($\lambda1$) as, or a wavelength ($\lambda2$) different from, the wavelength of the focusable energy beam for forming the pattern template 40, materials containing a light absorber that absorbs said wavelength well, or materials that are highly soluble in a solvent which is used in washing after a process.

Also, according to the choice and mixing of the materials used, said layers can perform a plurality of functions without distinction.

The sacrificial film 30 is adhered to the substrate 10 as described above, and will now be described.

The material of the sacrificial film 30 is not specifically limited as long as it is solid or semi-solid at room temperature and is vaporized or decomposed upon irradiation with an energy beam.

The preferred material for the sacrificial film is not specifically limited as long as it is a material such as polypropylene carbonate, which is solid or semi-solid at room temperature and is easily decomposed and evaporated using a focusable energy beam such as a laser beam. However, this material is merely an example of material for the sacrificial film 30, and the choice of the material for the sacrificial film 30 is determined in consideration of the intended use thereof, the kind of solvent, the physical and chemical properties in conjunction with the functional material, and the kind of focusable energy beam used.

Meanwhile, the sacrificial film 30 can be composed of a single layer consisting of a single material or a plurality of materials, or a plurality of layers. Particularly, if the sacrificial film 30 is composed of a plurality of layers, it can be composed of: one or more sticky or adhesive layers attached to the lower surface of the sacrificial film 30 in order to easily attach the sacrificial film 30 to the substrate 10 in a sticky or adhesive form; a light shielding layer for preventing a focusable energy beam from being transmitted through and under the sacrificial film 30; a sacrificial layer made of a low-molecular-weight or high-molecular-weight material or a mixture thereof, which can be easily removed using a focusable energy beam; a protective layer for preventing contamination from occurring before and during a process, which is made of, for example, polymethyl methacrylate (PMMA) resin, and a release film. Each of said layers can be selectively used in the present invention.

Figure 4A:
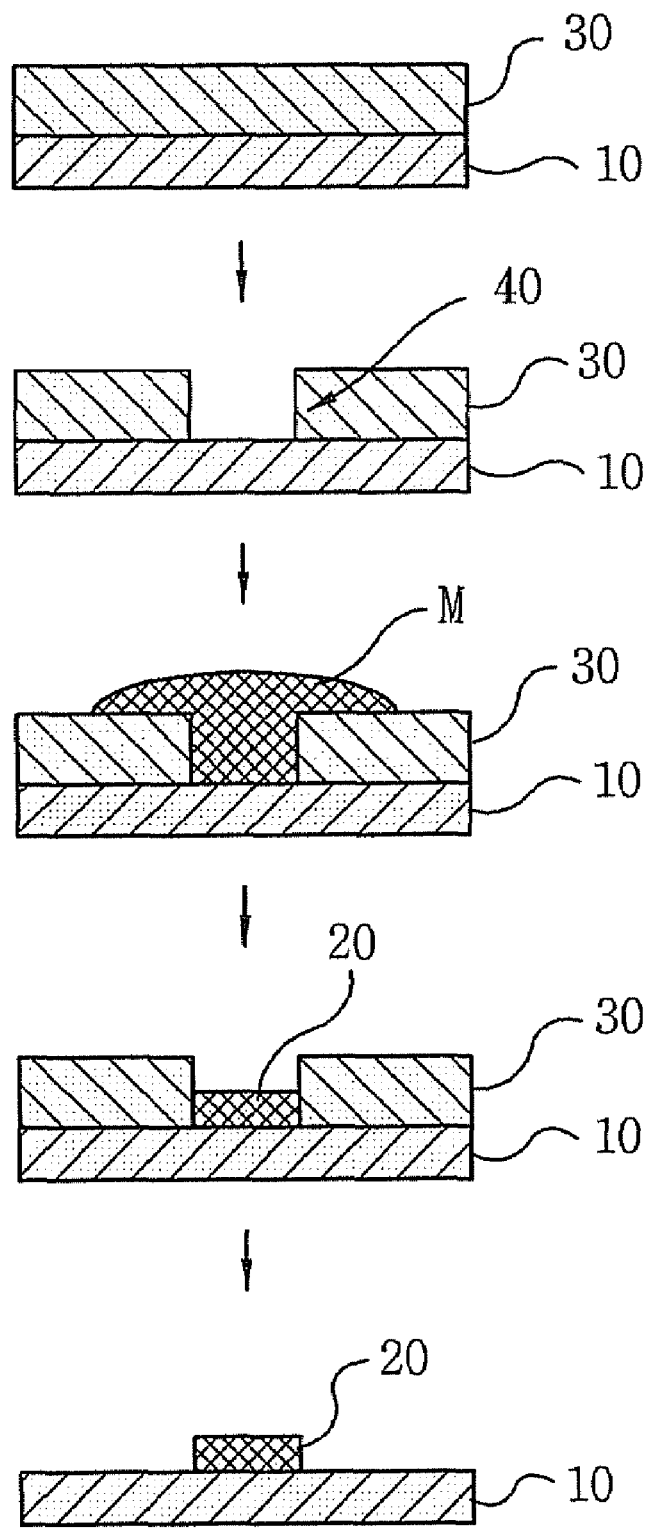
FIGS. 4 and 5 illustrate process diagrams of preferred embodiments of the present invention, which show regions to be deposited with a functional material(s), the regions being formed by irradiating a focusable energy beam such as a laser beam onto sacrificial films made of a low-molecular-weight material and a high-molecular-weight material, respectively.
Figure 4B:
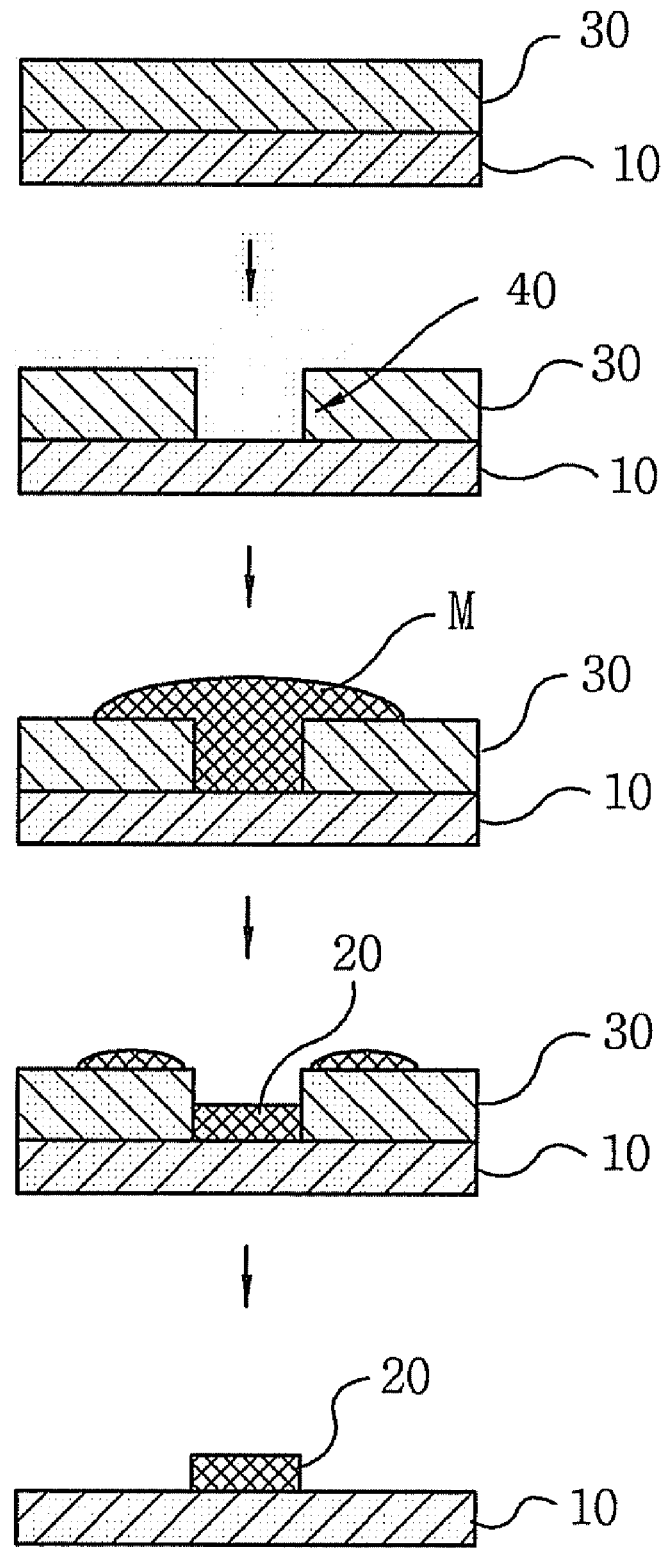

Meanwhile, in the case where the sacrificial film, particularly, the sacrificial layer, is made of a low-molecular-weight polymer, when a portion to be deposited with the functional material is removed using a focusable energy beam, the corner of the resulting pattern template 40 tends to appear clean. Meanwhile, when the low-molecular-weight polymer is used as a material for forming the sacrificial film, the functional material will be self-aligned to the pattern template due to the difference in wettability from the sacrificial film (see FIG. 4a). Alternatively, the functional material is deposited in a state in which a portion of the functional material in the pattern template and a portion of the functional material on the sacrificial film are separated from each other or weakly connected with each other (see FIG. 4b).

Figure 5A:
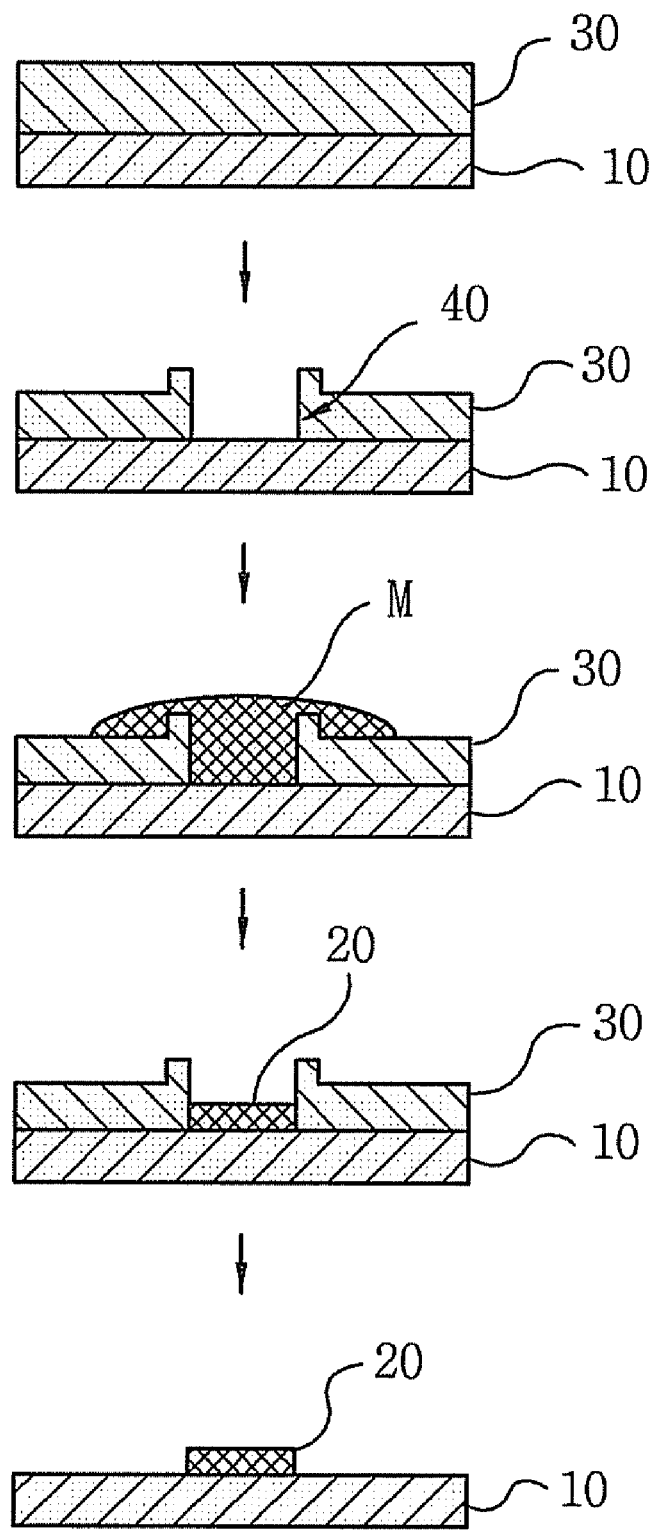
Figure 5B:
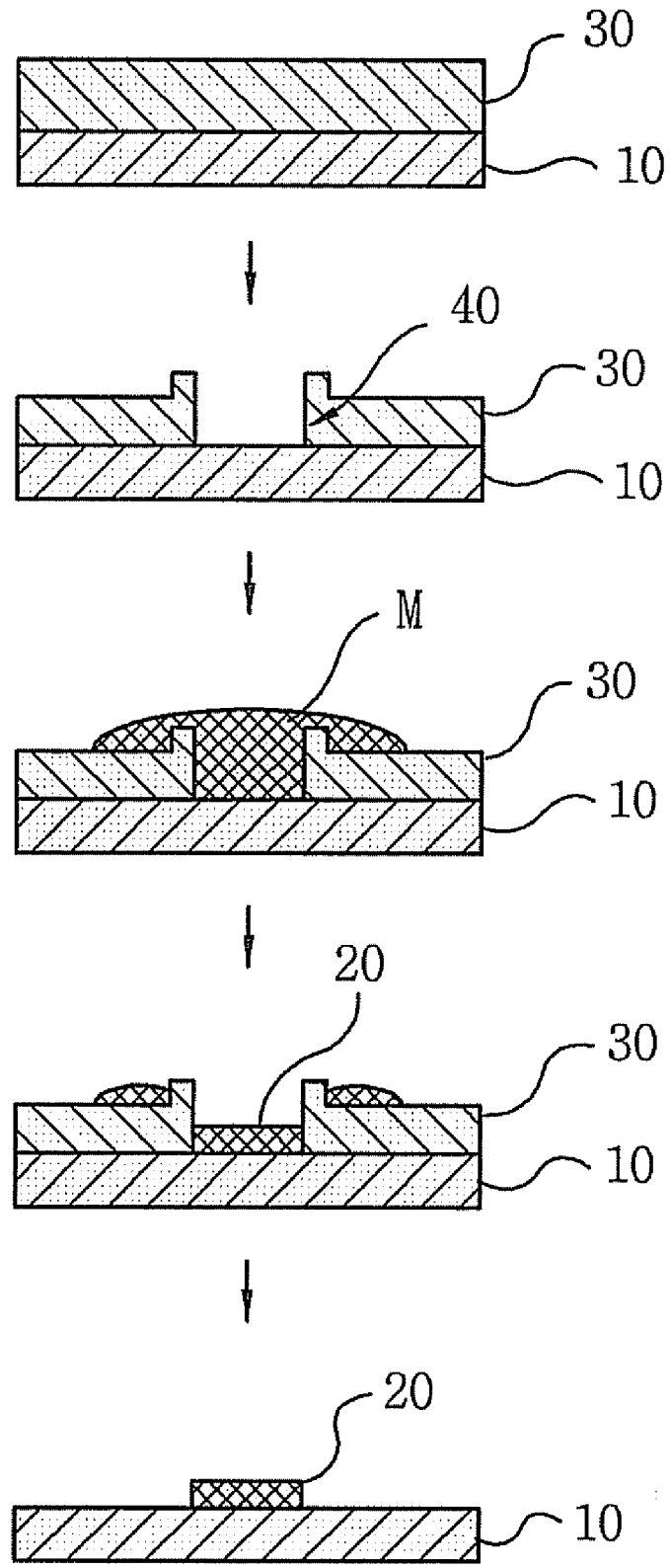

Particularly, when the sacrificial film is made of a high-molecular-weight polymer, a barrier can be formed at the corner of the pattern template, as shown in FIGS. 5a and 5b, and the deposited shape of the functional material is similar to the case of the low-molecular-weight polymer due to the difference in wettability as described above.

If the barrier is formed in the case of the high-molecular-weight polymer as described above, the separation between the functional material deposited on the sacrificial film and the functional material deposited on the substrate 10 will more easily occur, so that the removal of unnecessary functional material will be more easily achieved when the removal of the sacrificial film is subsequently required.

On the lower surface of the uppermost removable film, a surface-modifying surfactant is coated, which serves to control surface wettability when the functional material is deposited after the removable film is subsequently removed and the pattern template is formed using a focusable energy beam. Alternatively, the surfactant may be contained in the sacrificial layer or the protective layer. Alternatively, it can also be coated after removing the removable film.

If the surface-modifying surfactant is coated so that the surface of the sacrificial film has a low affinity for ink, the functional material deposited shows a strong tendency to be self-aligned to the pattern template due to low affinity for the upper surface of the sacrificial film. On the other hand, as the wettability between the upper surface of the sacrificial film and the functional material increases, the functional material spreads thin on the sacrificial film, and thus it shows a strong tendency to be deposited in a state in which the functional material on the sacrificial film and the functional material in the region from which the sacrificial film was removed are separated from each other after drying (see FIG. 4a) or are weakly connected with each other (see FIG. 4b).

Alternatively, a material having suitable wettability (such as non-affinity or affinity) with the functional material may also be deposited on the lower surface of the uppermost removable film.

Alternatively, after the removal of the removable film, the surface properties of the sacrificial film can be changed as required through dry treatment, such as room temperature plasma or corona treatment.

The sacrificial film 30 can contain suitable additives for controlling cohesion or adhesion to the substrate 10, or to increase the adhesion between the sacrificial film 30 and the substrate 10, or to maintain suitable wettability with the functional material, or to impart suitable flexibility to the sacrificial film 30, or to increase the ability to absorb a focusable energy beam.

In the particular case of a laser beam among the focusable energy beams, a visible- or infrared-wavelength laser beam is preferably selected when the material of the sacrificial film 30 is decomposed and evaporated with heat induced by laser beam. When the material of the sacrificial layer is removed by breaking the chemical bonds thereof, a UV-wavelength laser beam is preferably selected.

When the material of the sacrificial film shows the maximum absorption spectrum at the laser wavelength used, it can be used without an additive to help light absorption. However, it can also contain an additive showing maximum absorption in the wavelength region used, so that it can be easily removed.

With respect to the choice of a light absorber as an additive, it is preferable to use a light absorber that is highly soluble in a solvent for dissolving the sacrificial film material, but is almost insoluble in a solvent for dissolving the functional material(s). When the sacrificial film is removed through thermal decomposition, it is advantageous to use an absorber for which specific heat and latent heat are as low as possible. When only the sacrificial film material is selectively removed using a solvent, it is preferable to use an absorber which is readily soluble in a solvent that does not dissolve the functional material.

In the particular case of a laser beam among focusable energy beams, materials used to increase light absorbance include diazoalkyl, diazonium salts, azido compounds, ammonium salts, oxides, carbonates, peroxides, and mixtures thereof. When the sacrificial film is irradiated with a focusable energy beam having an infrared wavelength, it is possible to use any one selected from the group consisting of polyphthalocyanine compounds, metal-containing phthalocyanine compounds, cyanine dyes, squarylium dyes, chalcogenopyryioacrylidene dyes, croconium dyes; metal thiolate dyes, bis(chalcogenopyrylo) polymethine dyes, oxyindolizine dyes, bis(aminoaryl) polymethine dyes, merocyanine dyes, quinoid dyes, and mixtures thereof. Also, it is possible to use an inorganic material selected from among transition metal elements, the elements of groups IIIa, IVa, Va, VIa, VIII, IIIb and Vb, and mixtures thereof. In addition, the elements of group IVb, such as carbon, can also be used. The choice of the light absorber is related to the choice of the sacrificial film material or the focusable energy beam used, and the scope of the present invention is not limited to the above-listed absorbers.

Meanwhile, plasticizers that can be used in the present invention to increase the flexibility of the sacrificial film include, but are not limited to, diphenyl phthalate derivatives such as diphenyl phthalate and di-(2-ethylhexyl) phthalate, ricinoleic acid derivatives, such as butyl ricinoleate and propylene glycol ricinoleate, sebacic acid derivatives, such as dibutyl sebacate and dimethyl sebacate, stearic acid derivatives, such as n-butyl stearate and propylene glycol monostearate, succinic acid derivatives, such as diethyl succinate, sulfonic acid derivatives, such as N-ethyl o,p-toluenesulfonamide, phosphoric acid derivatives, such as tricresyl phosphate and tributyl phosphate, paraffin derivatives, such as chloroparaffins, palmitic acid derivatives, such as isopropyl palmitate and methyl palmitate, oleic acid derivatives, such as butyl oleate and glycerol trioleate, myristic acid derivatives, such as isopropyl myristate, mellitates, such as tricapryl trimellitate and triisodecyl trimellitate, maleic acid derivatives, such as di-n-butyl maleate and di-(2-ethylhexyl) maleate, linoleic acid derivatives, such as methyl linoleate, lauric acid derivatives, such as methyl laurate, isophthalic acid derivatives, such as diphenyl isophthalate and dimethyl isophthalate, isobutyrate derivatives, such as 2,2,4-trimethyl- 1,3-pentanediol, diisobutyrate, glycerol derivatives, such as glycerol triacetate, fumaric acid derivatives, such as dibutyl fumarate, epoxy derivatives, such as n-octyl epoxystearate, citric acid derivatives, such as tri-n-butyl citrate and acetyl triethyl citrate, benzoic acid derivatives, such as diethylene glycol dibenzoate and dipropylene glycol dibenzoate, azelaic acid derivatives, such as diisodecyl azelate and dimethyl azelate, and adipic acid derivatives, such as dicapryl adipate and diisodecyl adipate.

In the pattern formation method according to the present invention, before or after the step (S1) of attaching the sacrificial film 30 on the substrate 10, a protective layer can be deposited between the substrate and the film, i.e., on the substrate and/or under the sacrificial film and/or on the sacrificial film, such that the sacrificial film material removed using the focusable energy beam does not contaminate other regions of the substrate. This protective layer can be made of a water-soluble polymer when a polar solvent is used in a washing process, and it can be made of a water-insoluble polymer when a non-polar solvent is used in a washing process, but the scope of the present invention is not limited thereto. As the protective layer and the solvent used for the removal thereof, materials which do not influence the deposited functional material(s) are selected.

The substrate 10 and the sacrificial film 30, which are used in the present invention, have been described above. Hereinafter, the inventive method will be described, and comprises: an attachment step (S1) of attaching the sacrificial film 30 onto the substrate 10; a pattern template-forming step (S2) of irradiating the sacrificial film 30 with a focusable energy beam to pattern the sacrificial film 30 into the desired shape, thus forming the pattern template 40; and a deposition step (S3) of depositing the functional material M into the pattern template 40 of the sacrificial film 30, formed by said patterning.

First, the attachment step (S1) of attaching the sacrificial film 30 onto the substrate 10 will be described with reference to FIGS. 2a to 2d. The substrate 10 and the sacrificial film 30 are attached to each other by lamination, and can be heated in order to make the operation easy (see FIG. 2a). However, the method of depositing the sacrificial film in said step is not specifically limited in the present invention as long as it is an attachment method which is generally used in the art.

Figure 2A:
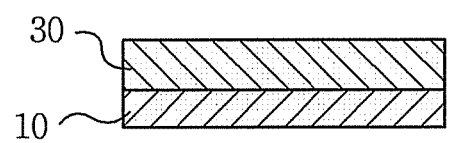
FIG. 2 is a schematic process diagram showing a patterning method according to the present invention.
Figure 2B:
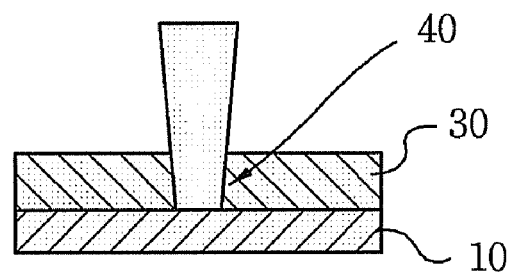
Figure 2C:
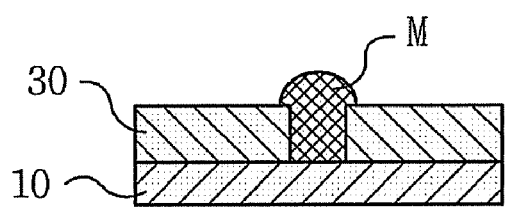
Figure 2D:
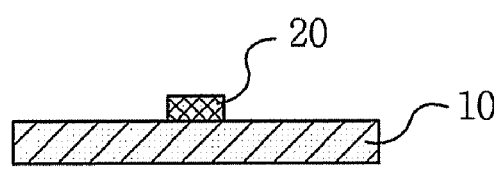

After conducting the attachment step (S1), the step (S2) is performed, in which the sacrificial film is irradiated with a focusable energy beam to pattern the sacrificial film, thus forming the pattern template 40 (see FIG. 2b).

Specifically, the sacrificial film 30 attached to the substrate 10 is patterned into the desired shape, thus forming a partially removed region of the sacrificial film 30, which is the pattern template 40. Herein, the focusable energy beam, such as a laser beam as described above, is used, and information on the output, size and scanning rate of the focusable energy beam, and the patterning of the sacrificial film, is controlled using digitized data input into a computer.

Into the region from which the sacrificial film 30 has been selectively removed through the patterning step for forming the pattern template as described above, that is, into the pattern template 40, the functional material is finally deposited. Then, the remaining sacrificial film is removed to form the desired pattern 20 (see FIGS. 2c and 2d).

Meanwhile, in the step (S2) of forming the pattern template 40, the focusable energy beam can also be irradiated onto the back side of the substrate 10, but not on the upper side.

Herein, the sacrificial film 30 is removed by irradiating the upper side or back side of the substrate 10 with the focusable energy beam, and the removed sacrificial film 30 can sometimes be introduced into a working environment, contaminate either the region from which the film is removed or the region deposited with the functional material M, or contaminate the optical system of the focusable energy beam. To prevent this phenomenon, it is also preferable to irradiate the focusable energy beam without removing the uppermost removable film.

Meanwhile, when the focusable energy beam, such as a laser beam, is used in the patterning step of forming the pattern template 40 by selectively removing the sacrificial film 30, a beam shaper such as a mask or a diffractive optical element can be selectively used to control the shape of the beam to be advantageous for the patterning.

Figure 3:
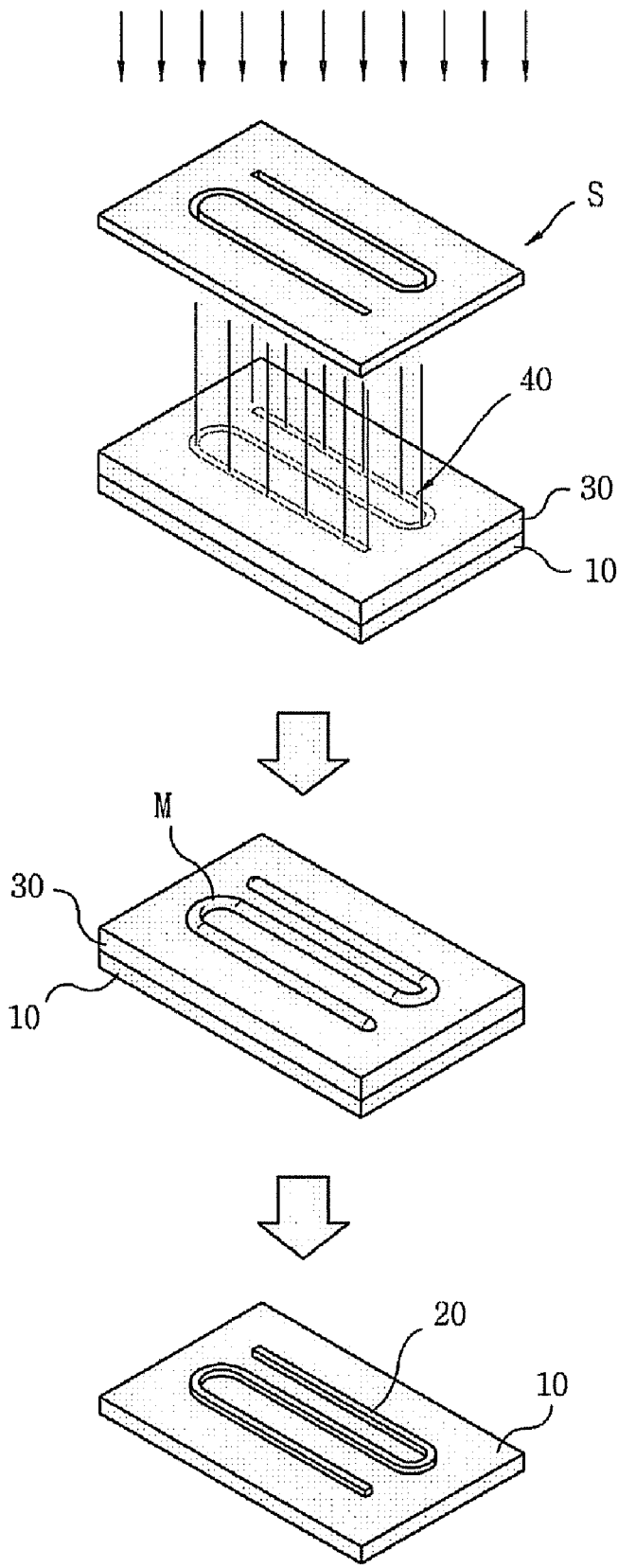
FIG. 3 is a schematic process diagram showing a method of easily forming a complex high-resolution pattern according to the present invention.

Herein, the use of the beam mask encompasses, in addition to the use of a mask for large-area patterning in conventional photolithography, the use of a partial mask located in a beam path to control the shape of a focusable energy beam, such as a laser beam. Also, the use of a diffractive optical element includes the use of a partial diffractive optical element, which covers the entire area of the region to be patterned, or which is located on a beam path to control the shape of a focusable energy beam such as a laser beam (see FIG. 3).

In said method, a complex pattern can be formed using the beam shaper with a mask and/or a diffractive optical device for controlling the shape of the beam, either through maskless laser direct writing, in which a focusable energy beam such as a laser beam is irradiated directly onto the substrate without the use of a mask or diffractive optical element other than the shape beam, or through mask-based laser scanning, in which a focusable energy beam such as a laser beam is scanned onto the substrate using a mask or diffractive optical element separately from the beam shaper. In addition to the use of the mask and/or diffractive optical element for the beam shaper, the use of the mask on the substrate embraces, in addition to the use of a large-area mask that can achieve large-area patterning, as in conventional photolithography, the use of a mask on a portion of the substrate. In addition to the use of the mask and/or diffractive optical element for the beam shaper, the diffractive optical element can be used on all or part of the substrate, like the use of the mask on the substrate.

In order to control the shape of the focusable energy beam through the beam shaper S, a diffractive optical element is preferable to a mask, but the invention not specifically limited thereto.

The pattern template 40 is formed by patterning the sacrificial film 30 according to the above-described method. The functional material is deposited on the formed pattern template 40, and the sacrificial film is then removed, thus forming the pattern 20 (see S3).

Hereinafter, the deposition step (S3) for forming the pattern 20 will be described.

The method of depositing the pattern 20 is not specifically limited as long as it is conventionally used in the art. For example, the following method can be used.

Examples of the method of depositing the pattern 20, which can be used in the present invention, include: an inkjet method of spraying and depositing the functional material; a screen printing method of depositing the pattern on the substrate using a stencil mask (also called "screen") and a squeegee; an electrostatic printing method of depositing the pattern using a functional material having electric charges; an offset printing method of placing the functional material on a rubber sheet (called "blanket") and transferring the functional material on the blanket to the substrate; a gravure printing of making a gravure plate, placing the functional material on the blanket, as in offset printing, and then indirectly printing the substrate using the functional material; a flexographic printing method (a kind of relief printing) that uses flexible resin or a rubber relief plate; a printing method that uses a soft mold; a spin coating method of depositing the functional material using a method in which a plate to be coated is rotated while a polymer is dropped on the center of the rotating plate so that the polymer is coated on the entire surface of the plate due to the rotating centrifugal force of the plate; and a slit coating method of depositing the functional material using a slit coater.

Also, it is possible to use a drop-on-demand method of discharging ink on the desired region. Examples of the drop-on-demand method include a thermal method that uses a thermal heater as a driving source for the discharge of ink, and a piezoelectric method of pushing out ink using pressure generated by a piezo-element.

In addition, it is also possible to use a continuous ink jet method of depositing the functional material, in which ink is always discharged and the direction of ink is changed at the desired time.

Furthermore, the deposition step (S3) can also be performed by depositing a fluid stream sprayed (atomized) or vaporized through a nozzle, directly on the substrate 10 using digitized data, thus forming the pattern.

Also, the deposition step (S3) can be performed by depositing the functional material directly on the substrate using digitized data through a laser transfer method such as MAPLE DW or laser-induced thermal imaging. As used herein, the term "laser transfer method" refers to a technique of forming a band-shaped pattern on the substrate by preparing on transfer paper a film to be transferred, exposing to a laser beam a portion of the film to be transferred, to form an image, transferring the imaged film onto the substrate and detaching the film from the substrate.

Meanwhile, in the above-described inventive method comprising irradiating the sacrificial film 30 with the focusable energy beam, such as a laser beam, to form the pattern template 40 and then depositing the functional material into the pattern template 20 through an inkjet method to form the pattern 20, it is also possible to deposit the functional material M using a combination of the functional material and any one of heat, plasma, and laser and ion beams.

Meanwhile, the deposition step (S3) can also be performed using a dip coating method. Specifically, it is also possible to form the pattern in an electroless plating manner by depositing a seed material for electroless plating into the pattern template 40 and then dipping the substrate in a chemical reaction solution.

The deposition step (S3) can also be performed by depositing the functional material on the substrate 10 using a chemical vapor deposition (CVD) method.

Meanwhile, it is preferable to increase deposition efficiency by heating the substrate, 10 having formed thereon the sacrificial film, during the deposition step (S3).

According to a preferred embodiment of the present invention, an inkjet method, which is a direct patterning method, is preferably used to deposit the expensive functional material, but other methods can also be used as long as they do not impair the purpose of the present invention.

After depositing the liquid functional material, a drying step is carried out. If necessary, unnecessary functional material remaining on the sacrificial film can also be washed out using, for example, a blade, scraper or wiper, after the drying step.

After the deposition step (S3) and the drying step, the functional material made of, for example, silver nanoparticles, sometimes shows increased resistance because the particles are loosely connected with each other. In this case, it is preferable to conduct heat treatment at 100° C. or higher to bind the functional material particles tightly to each other, thus improving electrical properties.

Also, the invention method preferably comprises, after the deposition step (S3), a step of inducing the photochemical reaction (e.g., photocuring) of the functional material. In other words, the inventive method may further comprise a step of changing the physical and chemical properties of the functional material by curing the functional material using a general UV curing machine, or inducing the curing of the functional material using an electron beam.

Also, the inventive method may comprise, after the deposition step (S3), a step of inducing the chemical reaction of the functional material M by chemical treatment. For example, when a colloidal electroless plating solution containing palladium is applied into the pattern template 40 using an inkjet, and a solution, containing metal ions and a reducing agent such as formaldehyde or hydrazine, is applied thereon using an inkjet in a state in which the sacrificial film 30 is removed or not removed, a reduction reaction will occur due to the patterned catalyst, thus forming a metal pattern.

In addition to the reduction reaction as described above, it is also possible to use a displacement reaction, such as displacement plating, which uses the difference in oxidation/reduction power. Also, a chemical reaction can take place, in which a metal precursor is reduced into the desired metal by first applying the metal precursor into the pattern template 40 using an inkjet, and then immersing the substrate in a catalyst-containing reducing solution or applying the reducing solution selectively on the pattern.

The present invention is not limited to the above examples, and can encompass an example of irradiating the sacrificial film 30, having sufficient thickness, with a focusable energy beam such as a laser beam to form the pattern template, and using the pattern template as a chemical reaction site for the functional material, which is finally patterned, as long as the example does not impair the purpose of the present invention.

Meanwhile, after the deposition step (S3), the functional material may also be subjected to a phase change from a liquid phase to a solid phase.

In other words, after the functional material made of, for example, a liquid metal mixture or compound, is sprayed into the pattern template, it can be changed to a solid phase.

Also, after the functional material M is deposited, the pattern 20 is preferably irradiated with a laser or plasma beam to improve the properties thereof.

After the above-described deposition step (S3) is carried out, step (S4) is finally conducted, in which the sacrificial film remaining on portions other than the pattern is removed so that unnecessary functional material remaining on the sacrificial film is also removed, thus leaving the pattern made of the functional material.

The removal of the sacrificial film can be performed using a method that uses a solvent or solution for selectively dissolving only the sacrificial film, a method of promoting the removal of the sacrificial film by heating, or a dry etching method such as room temperature plasma, reactive ion etching or $UV/O_3$.

Also, the removal of the sacrificial film or the functional material deposited on the sacrificial film can be performed using a method of irradiating an energy beam having a diameter greater than that of the focusable energy beam used for patterning (i.e., the formation of the pattern template), and this removal method will now be described in further detail.

Specifically, assuming that the material of the sacrificial film is removed by a laser beam having an energy density of 50 $mJ/cm^2$, and that the functional material is removed by a laser beam having an energy density of 200 mJ/cm², when a laser beam is focused to a diameter of, for example, about 5 µm, the energy density thereof is 100 mJ/cm². Using this energy beam, the sacrificial film is partially removed to make a groove having a width of about 5 µm. The functional material is charged into the groove (pattern template) and then dried. When the diameter of said laser beam is enlarged greater than 5 µm to remove the remaining sacrificial film, the energy density thereof will be decreased to less than 200 mJ/cm², so that the sacrificial film can be removed, but the functional material will not be removed. With the removal of the sacrificial film, the functional material deposited thereon can also be removed.

In other words, when an energy beam having a diameter larger than the diameter of the energy beam used to form the pattern template is irradiated, only the sacrificial film is selectively removed at a power density and energy density higher than required for the removal of the sacrificial film, but lower than required for the removal of the functional material.

Meanwhile, the sacrificial film does not necessarily need to be removed, and if necessary, can show other functionalities itself. For example, when a passivation or insulation layer covering the protective film is required, the sacrificial film itself or at least one layer of the plurality of layers constituting the sacrificial film can be a material suitable for this purpose. In this case, the sacrificial film does not necessarily need to be removed.

After the removal of the sacrificial film, thermal/chemical treatment can also be carried out to improve the properties of the patterned functional material.

As can be seen from the foregoing, according to the pattern formation of the present invention, a high-resolution pattern can be formed in a simple manner without wasting the functional material. Also, the substrate having formed thereon the high-resolution pattern according to the present invention can effectively prepare a high-resolution film by irradiating the sacrificial film with a focusable energy beam suitably selected depending on the kind of material of the sacrificial film deposited on the substrate, to secure a region to be charged with the functional material (i.e., ink), and then charging the functional material into the region.

As described above, the substrate having formed thereon the free pattern according to the present invention makes it possible to obtain a high-resolution pattern without wasting functional material, thus reducing the production cost of the substrate. Also, according to the present invention, a pattern having a high aspect ratio, which is difficult to obtain in the prior process, can be obtained by applying the functional film using the thickness of the sacrificial film. In addition, according to the method for forming the pattern using the substrate having formed thereon the free pattern, the high-resolution pattern can be produced at high process efficiency.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a high-resolution pattern having a desired thickness or high aspect ratio using deep ablation by partially removing a sacrificial film attached to a substrate and depositing a functional material into the region from which the sacrificial film was removed, the method comprising:

a sacrificial film-attaching step (S1) of attaching onto a substrate a sacrificial film having a thickness of $100 \times \beta/\alpha$ (µm) or more using a laminating device, assuming that the volume fraction of the functional material, which will finally remain as a film, is $\alpha$ (vol %), and that the thickness of pattern required is $\beta$ (µm);

a pattern template-forming step (S2) of irradiating the attached sacrificial film with a focusable energy beam to pattern the sacrificial film into a desired shape, thus forming a pattern template; and a deposition step (S3) of depositing a functional material into the pattern template to form a pattern.

2. The method of claim 1, which flirt her comprises, after the step (S3), a step (S4) of removing the sacrificial film remaining on regions other than the pattern region, so that unnecessary functional material remaining on the sacrificial film is also removed, thus leaving only the pattern made of the functional material.

3. The method of claim 2, wherein the removal of the sacrificial film is performed by removing the sacrificial film using a solvent or solution for dissolving the sacrificial film and, at the same time, removing the functional material deposited on the sacrificial film.

4. The method of claim 2, wherein, in the removal of the sacrificial film and the functional material deposited on the sacrificial film, heating is conducted to promote the removal of the sacrificial film.

5. The method of claim 2, wherein the removal of the sacrificial film and the functional film deposited on the sacrificial film is performed by selectively removing only sacrificial film by irradiating the substrate with a focusable energy beam having a diameter greater than that of the energy beam used for the patterning of the sacrificial film, when the power density and energy density of the beam required for the removal of the sacrificial film are lower than those of the beam required for the removal of the functional material.

6. The method of claim 2, wherein the removal of the sacrificial film is performed using a dry etching method selected from among room temperature plasma, reactive ion etching, and a UV-ozone method.

7. The method of claim 2, wherein the sacrificial film is not removed after the step (S3) but rather performs a function itself.

8. The method of claim 1, wherein, if the substrate has a pattern formed thereon, it further comprises any one selected from among: a protective layer for protecting said pattern; a light shielding layer for shielding the focusable energy beam to protect the lower portion of the substrate; an adhesive layer having sticky or adhesive force for increasing the adhesion of the sacrificial film to the substrate; and a removable film for protecting the adhesive layer during the storage of the substrate.

9. The method of claim 8, wherein either the protective layer or the light shielding layer is deposited first in sequence from the substrate, or these layers are alternately deposited on each other, or the protective layer, the light shielding layer or the adhesive layer are individually deposited, or one layer of these layers performs the functions of the other layers.

10. The method of claim 1, wherein the sacrificial film consists of at least one of the following layers made of materials which are easily removed by the focusable energy beam: an uppermost removable layer for protecting the substrate during the storage of the substrate; a protective layer for preventing contamination from occurring during processing; a sacrificial layer made of a low-molecular-weight material, a high-molecular-weight material or a mixture thereof, which are easily removed by the focusable energy beam; a light shielding layer for preventing the focusable energy beam from being transferred below the sacrificial film; an adhesive layer having sticky or adhesive force, which is attached to the lower surface of the sacrificial film in order to easily attach the sacrificial film to the substrate; and a lowermost removable film for preventing contaminants from adhering to the adhesive layer; and one layer of the layers simultaneously performs functions of the other layers.

11. The method of claim 10, wherein a surfactant, a polymer layer or a surfactant-containing polymer layer is coated on the lower surface of the uppermost removable layer in order to control wettability such as hydrophobicity or hydrophilicity with the functional material.

12. The method of claim 10, wherein, after the uppermost removable film of the sacrificial film is removed, a surfactant is coated on the sacrificial film in order to control wettability such as hydrophobicity or hydrophilicity with the functional material.

13. The method of claim 10, wherein, after the uppermost removable film of the sacrificial film is removed, the surface of the sacrificial film is treated using a dry treatment method such as room temperature plasma or corona in order to control wettability such as hydrophobicity or hydrophilicity with the functional material.

14. The method of claim 10, wherein a low-molecular-weight polymer is used as material of the sacrificial film, when a corner of the pattern template formed by removing the sacrificial film with the focusable energy beam needs to be clean.

15. The method of claim 10, wherein a high-molecular-weight polymer is used as material of the sacrificial film, when a corner of the pattern template formed by removing the sacrificial film with the focusable energy beam needs to have a barrier.

16. The method of claim 10, wherein a combination of a low-molecular-weight polymer with a high-molecular-weight polymer is selected as material of the sacrificial film to control the physical and chemical properties of the sacrificial film.

17. The method of claim 10, wherein the material of the sacrificial film contains a light absorber for increasing the absorption of the focusable energy beam.

18. The method of claim 10, wherein the material of the sacrificial film contains a plasticizer for increasing the flexibility of the sacrificial film.

19. The method of claim 1, wherein a laser or electron beam or a focused ion beam is used as the focusable energy beam for removing the sacrificial film in the step (S2) of forming the pattern template.

20. The method of claim 1, wherein, in the step (S2) of forming the pattern template, the focusable energy beam is irradiated directly onto the substrate while controlling the focusable energy beam using digitized data on the output, size and scanning rate of the beam, and the patterning of the sacrificial film.

21. The method of claim 1, wherein, in the step (S2) of forming the pattern template, a beam shaper with a mask or diffractive element is used to control the irradiation shape of the focusable energy beam.

22. The method of claim 1, wherein, in the step (S2) of forming the pattern template, a mask or a diffractive optical element is used on the substrate in order to control the irradiation shape of the focusable energy beam.

23. The method of claim 1, wherein, in the step (S2) of forming the pattern template, the focusable energy beam is irradiated on a back side of the substrate, but not on a front side of the substrate.

24. The method of claim 1, wherein, in the step (S2) of forming the pattern template, the irradiation of the focusable energy beam through a front side or back side of the substrate is carried out without the removal of the uppermost removal film in order to prevent the removed sacrificial film material from being introduced into a working environment, or from contaminating either a region from which the film was removed or a region deposited with the functional material, or from contaminating an optical system of the focusable energy beam.

25. The method of claim 1, wherein the deposition step (S3) is performed using a drop-on-demand method of depositing the functional material directly onto the substrate using digitized data.

26. The method of claim 1, wherein the deposition step (S3) is performed using a continuous inkjet method of depositing the functional material directly onto the substrate using digitized data.

27. The method of claim 1, wherein the deposition step (S3) is performed using an electrostatic deposition or electro spraying method of depositing the functional material directly onto the substrate using digitized data.

28. The method of claim 1, wherein the deposition step (S3) is performed by depositing a fluid stream which is atomized or sprayed through a nozzle, directly onto the substrate using digitized data.

29. The method of claim 1, wherein the deposition step is performed according to a laser transfer method of depositing the functional material directly onto the substrate using digitized data.

30. The method of claim 1, wherein the deposition step (S3) is conducted using at least one selected from among a screen printing method, a rotary screen printing method, an offset printing method, a gravure printing method, a pad printing method, a flexo printing method, a letterpress printing method, and a printing method that uses a soft mold, and combinations thereof.

31. The method of claim 1, wherein the deposition step (S3) is conducted using at least one selected from among a spin coating method, a slit coating method, a dip coating method, and combinations thereof.

32. The method of claim 1, wherein the deposition step (S3) is conducted using a source to be deposited and at least one from among heat, plasma, a laser beam, an ion beam, and sputtering.

33. The method of claim 1, wherein the deposition step (S3) comprises immersing in a solution the substrate having formed thereon the sacrificial film to induce a chemical reaction.

34. The method of claim 1, wherein the deposition step (S3) comprises subjecting the substrate including the sacrificial film to vapor deposition or a chemical reaction.

35. The method of claim 1, wherein, in the deposition step (S3), the substrate having formed thereon the sacrificial film is heated.

36. The method of claim 1, which further comprises a drying step after the deposition step (S3).

37. The method of claim 1, which further comprises, after the deposition step (S3), a step of inducing a photochemical reaction such as photocuring.

38. The method of claim 1, which further comprises, after the deposition step (S3), a step of inducing the chemical reaction of the functional material by chemical treatment such as a reduction reaction or a displacement reaction.

39. The method of claim 1, which further comprises, after the deposition step (S3), a step of changing the phase of the functional material from a liquid phase to a solid phase.

40. The method of claim 1, which further comprises, after the deposition step (S3), a calcining step of heating the functional material above 100° C. to improve the properties of the functional material.

41. The method of claim 1, which further comprises, after the deposition step (S3), a step of irradiating the pattern with a laser or plasma beam to improve the properties of the functional material.

42. The method of claim 1, which flirt her comprises, after the deposition step (S3), but before the sacrificial film removal step (S4), a step of removing unnecessary functional material remaining on the sacrificial film using a blade, a scraper or a wiper.

* * * * *